United States Patent [19]

Cheung

[11] 4,197,469
[45] Apr. 8, 1980

[54] CAPACITIVELY COUPLED ARRAY OF PHOTODETECTORS

[75] Inventor: Derek T. Cheung, Thousand Oaks, Calif.

[73] Assignee: Rockwell International Corporation, El Segundo, Calif.

[21] Appl. No.: 909,330

[22] Filed: May 25, 1978

[51] Int. Cl.² .................. G11C 19/28; H01L 29/78; H01L 27/14; H01L 31/00
[52] U.S. Cl. .................. 307/221 D; 307/311; 357/24; 357/30; 250/338; 250/370
[58] Field of Search .............. 357/24, 30; 307/221 B, 307/311; 250/211 J, 338, 370

[56] References Cited

U.S. PATENT DOCUMENTS

| | | | |
|---|---|---|---|
| 3,808,435 | 4/1974 | Bate et al. | 357/24 |
| 3,944,849 | 3/1976 | Tasch et al. | 307/221 D |
| 3,986,198 | 10/1976 | Kosonocky | 357/24 |
| 4,064,533 | 12/1977 | Lampe et al. | 357/24 |
| 4,067,104 | 1/1978 | Tracy | 29/626 |
| 4,093,872 | 6/1978 | Hartman et al. | 357/24 |
| 4,104,674 | 8/1978 | Lorenze et al. | 357/24 |
| 4,115,692 | 9/1978 | Balcerak et al. | 357/24 |

OTHER PUBLICATIONS

Emmons et al., "A CCD Multiplexer with Forty AC Coupled Inputs", Int. Conf. Application Charge-Coupled Devices, San Diego (10/75), Prec. pp. 43–52.

Primary Examiner—Gene M. Munson
Attorney, Agent, or Firm—L. Lee Humphries; Craig O. Malin

[57] ABSTRACT

A plurality of metal deposits are formed on the insulated surface of a semiconductive material to create an array of capacitive photodetectors. A plurality of metal columns connect the metal deposit of each photodetector to a corresponding metal deposit on the insulated surface of a silicon charge-coupled device (CCD). In this manner, the voltage signal generated in each photodetector is capacitively coupled to the charge-coupled device. The metal deposit on the CCD forms a gate for a fill/spill circuit which provides the input to the charge-coupled device. In a preferred embodiment, a bi-polar fill/spill circuit is used to provide an input to the CCD which is proportional to the change in voltage of a photodetector during a predetermined clocking period.

6 Claims, 11 Drawing Figures

CAPACITIVELY COUPLED ARRAY OF PHOTODETECTORS

BACKGROUND OF THE INVENTION

1. Field of the Invention

This invention relates to the field of solid state electronics, and particularly to the field of solid state arrays of photodetectors.

2. Description of the Prior Art

Prior art photodetector arrays are based on the use of photodiodes (p-n junctions). The array of photodiodes is coupled to a silicon chargecoupled device (CCD) by direct injection or by modulation through the gate of a field effect transistor (FET).

The unit cell size of such prior art devices is limited to a minimum of about $4 \times 4$ mil$^2$.

For prior art devices utilizing gate modulation coupling, the photodiodes' anode potential is determined, for small diode currents, by the threshold voltage of the top gate FET. Since the threshold voltage can vary appreciably (by as much as 50 mV) along the focal plane, the photodiode bias changes from individual photodiode to individual photodiode. Such change in bias causes a significant amount of fixed-pattern noise in prior art photodetector arrays.

Prior art devices utilizing direct injection are handicapped by low injection efficiency.

Photodetector arrays of capacitive detectors have not been used satisfactorily in place of photodiode detectors because of a lack of a suitable means for processing the capacitively couple voltage output of the capacitive detectors.

SUMMARY OF THE INVENTION

It is an object of the invention to provide a capacitively coupled array of photodetectors.

It is an object of the invention to provide a photodetector array coupled to a silicon multiplexer which is not sensitive to threshold voltage fluctuations.

It is an object of the invention to provide a photodetector array having a small unit cell size.

It is an object of the invention to provide a photodetector array which has built-in background suppression.

It is an object of the invention to provide a low noise input, high sensitivity photodetector array.

According to the invention, a plurality of metal deposits are formed on the insulated surface of a semiconductive material to create an array of capacitive photodetectors. A plurality of metal columns connect the metal deposit of each photodetector to a corresponding metal deposit on the insulated surface of a silicon charge-coupled device (CCD). In this manner, the voltage signal generated in each photodetector is capacitively coupled to the charge-coupled device. The metal deposit on the CCD forms a gate for a fill/spill circuit which provides the input to the charge-coupled device. In a preferred embodiment, a bi-polar fill/spill circuit is used to provide an input to the CCD which is proportional to the change in voltage of a photodetector during a predetermined clocking period.

These and other objects and features of the present invention will be apparent from the following detailed description, taken with reference to the accompanying drawings.

DESCRIPTION OF THE PREFERRED EMBODIMENT

Figure 1:
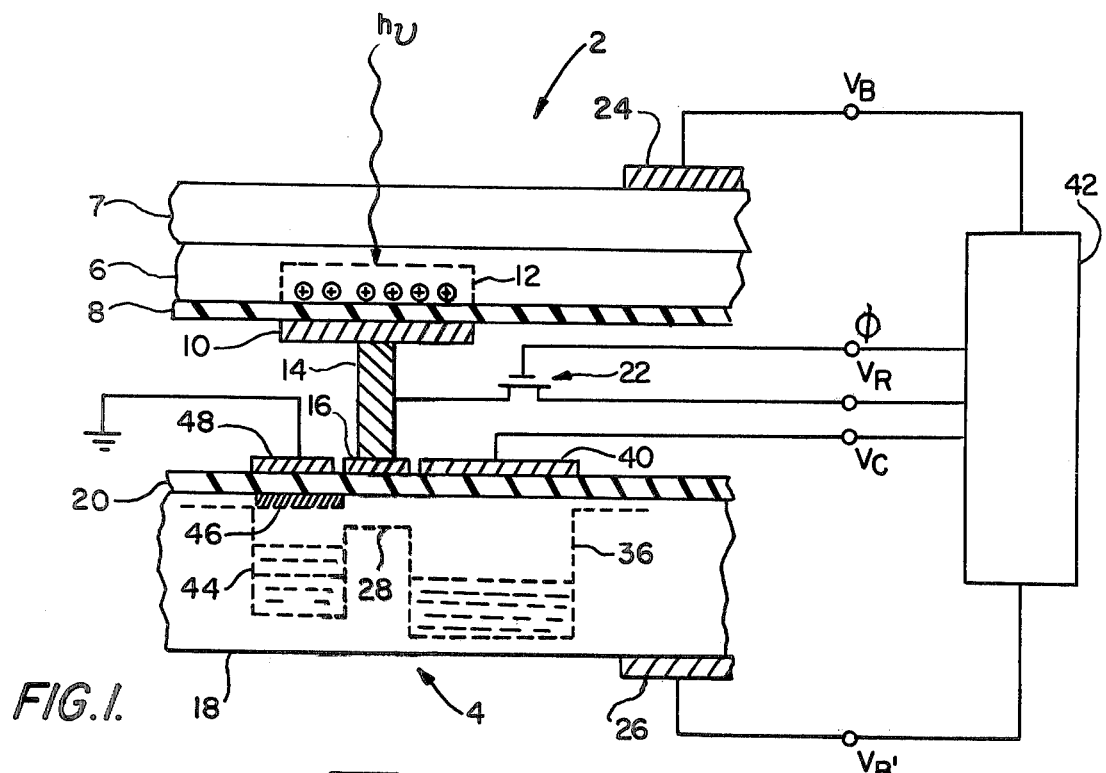
FIG. 1 is a partial cross section schematic of a photodetector array coupled to a silicon charge coupled device (CCD) illustrating an embodiment utilizing a bi-polar fill/spill circuit.

The detector array is a backside-illuminated metal-insulator-semiconductor (MIS) capacitor array which contains no p-n junctions. FIG. 1 shows an individual capacitive photodetector in such an array 2 to illustrate the capacitive coupling of the individual detector to a charge coupled device (CCD) or multiplexer 4. Array 2 comprises a photosensitive semiconductive material 6 on substrate 7. Examples of suitable materials include n-type InAsSb on n-type GaSb and n-type HgCdTe on n-type CdTe. An insulating layer 8, e.g. SiO$_2$, separates semiconductive material 6 from a metal deposit 10. When a suitable voltage is applied to deposit 10, a potential well 12 is created in material 6 to form an individual detector in the array 2.

The detector is coupled to CCD 4 by metal column 14 which extends from metal deposit 10 on array 2 to a corresponding metal deposit 16 on CCD 4. Such metal columns can be precisely positioned between two microelectronic circuits as described in U.S. Pat. No. 4,067,104.

Charge-coupled device 4 comprise a p-type chip of silicon 18 which is separated from deposit 16 by a layer of SiO$_2$ insulation 20. The use (including the driving electronics) of CCD's is a recent but known art, see for example "Charge-Coupled Devices: Technology and Applications" edited by Roger Melen and Dennis Buss and published by the Institute of Electrical and Electronic Engineers, Inc. Another publication on CCD's is "Charge Transfer Devices" by C. H. Sequin and M. F. Tompsett, published by Academic Press, Inc.

Switch 22 is coupled to column 14 so that reference voltages, V$_R$, can be applied to deposits 10, 16 to form depletion well 12 in array 2 and potential barrier 28 in CCD 4. By timing the actuation of switch 22, the surface potential, $\psi$, in semiconductive material 6, 18 under deposits 10, 16 can be reset periodically to begin a new cycle for the detector. Contacts 24, 26 on the array substrate 7 and CCD material 18 are provided so that a D.C. bias ($V_B$ and $V_{B'}$) can be applied for optimum operation.

Figure 2:
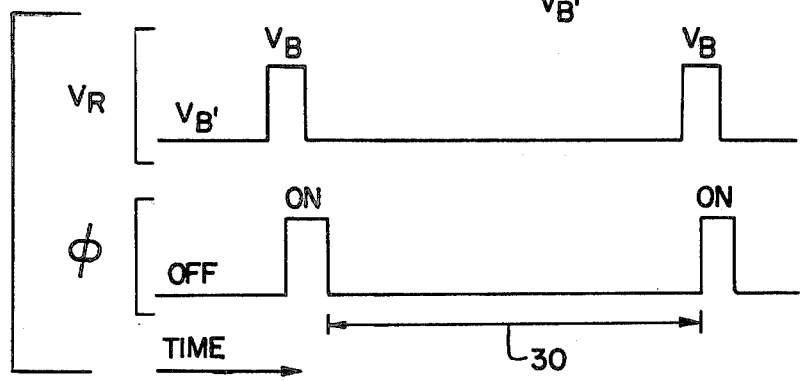
FIG. 2 is a pair of curves showing the relation between time, reset voltage, and switch position for bi-polar fill/spill circuit of FIG. 1.

In operation, switch 22 is closed by application of a timing cycle, $\phi$, to the gate of the FET forming switch 22. A typical on-off timing cycle, $\phi$, for controlling switch 22 is shown in FIG. 2. This switch applies cyclic reference voltages $V_R$ to the capacitors formed by detector 2 and by CCD 4.

FIG. 2 also show voltage $V_R$ and its relation to timing cycle $\phi$. The first applied voltage, $V_B$, discharges detector capacitor 2 through switch 22. The second applied voltage, $V_{B'}$, biases detector capacitor 2 into deep depletion as indicated by depletion well 12 in FIG. 1. The application of voltage, $V_{B'}$, also resets potential barrier 28 as will be discussed later. Reference voltages $V_R$ are turned off by switch 22 during integration time period 30. During this integration period, the voltage of column 14 is allowed to float. Deposit 16 then becomes a floating metering gate controlling the level of potential barrier 28.

Figure 3:
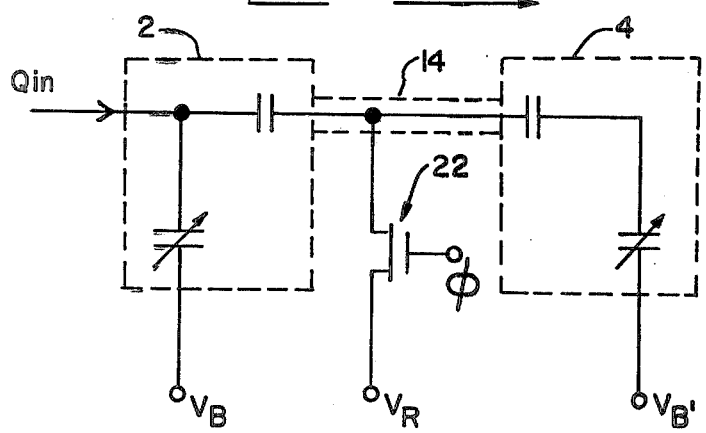
FIG. 3 is the circuit diagram equivalent of a portion of FIG. 1.

FIG. 3 shows a circuit diagram that represents the capacitive coupling of FIG. 1. Detector 2 and CCD 4 act as capacitors coupled in series by column 14. Switch 22 is connected between these two capacitors and can bias them by applying reference voltage $V_R$. The charge, $Q_{in}$, into detector 2 is created when radiation, $h\nu$, strikes photodetector 2 to create a photocurrent.

When the device is in integration time period 30, the detector capacitor relaxes from dep depletion to inversion in time due to the background photocurrent and to the dark current. This causes the potential of the floating deposit 10, column 14, and metering gate 16 to become increasingly more positive which in turn lowers the surface potential $\psi$ of potential barrier 28 in the p-type silicon of CCD 4.

Figure 4:
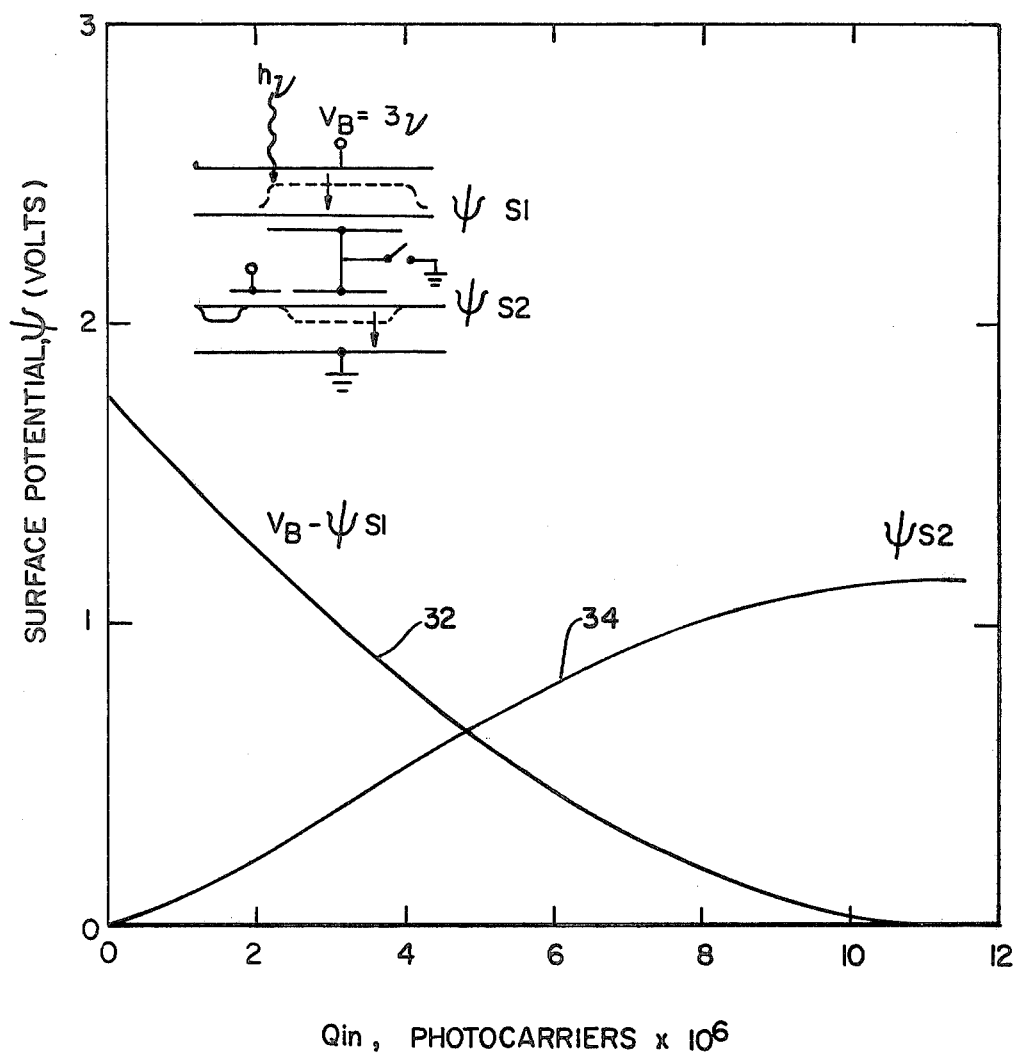
FIG. 4 shows the relation between surface potential on the detector and on the silicon as a function of charge into the detector of FIG. 1.

FIG. 4 shows the change in the surface potential of the photodetector (curve 32) and of the CCD (curve 34) as the charge in, $Q_{in}$, to the photodetector (primarily created by photocurrent) increases. As charge $Q_{in}$ is built up at the semiconductor-insulator interface in the detector, the surface potential $\psi$ in the detector decreases which causes the surface potential in the p-type silicon to increase. For the example shown in FIG. 4, a bias voltage, $V_B$, of 3.0 volts is used for photodetector 2 and a bias voltage $V_B$, of 0 volts is used for the CCD. The reset voltage, $V_R$, is 0 volt. Other bias voltages can be selected, depending upon the particular design of the assembly. Curve 34 shows that the surface potential in the CCD is related to the charge into the photodetector, and this relationship controls the potential of barrier 28 to obtain a charge pocket through a fill and spill circuit in the CCD as explained later.

Figure 5:
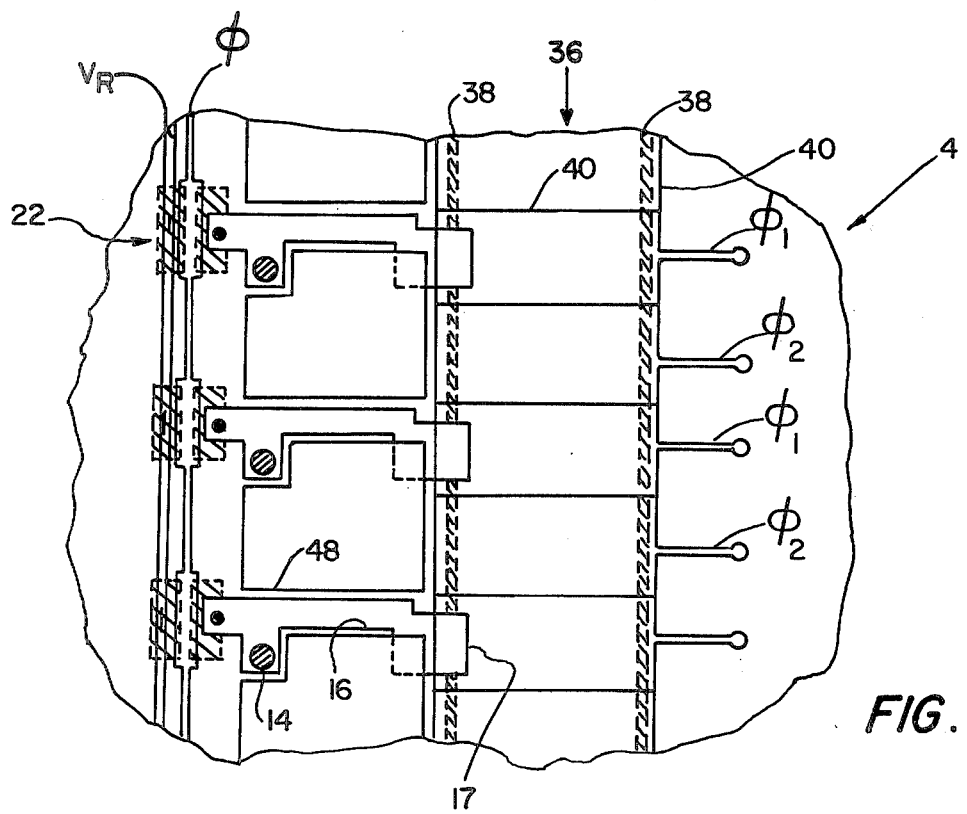
FIG. 5 is a partial plan view of a silicon charge coupled device such as that shown in FIG. 4.

FIG. 5 in partial plan view of a CCD based upon a circuit such as shown in FIG. 1. Columns 14 are joined to CCD 4 by metal deposits 16 which form the metering gate 17 to the wells 36 in the transfer channel of CCD 4. The row of wells 36 is isolated from p-type silicon substrate 18 by two strips of p+ type ion implantation 38, and the individual wells are defined by metal deposits 40. FET switch 22 connects each column to a time signal $\phi$ and to reset reference voltages, $V_R$, as previously discussed. Wells 36 are connected to an electronic means 42 in a known manner to provide two-phase, $\phi_1$, $\phi_2$, clocking of the charges in channel 36.

The change in the capacitively coupled voltage signal (change in surface potential) created by radiation $h\nu$ in photodetector 2 is converted to a charge packet by using a fill/spill circuit. FIG. 1 shows a special bi-polar fill/spill circuit created specifically for the invention. The circuit is called bi-polar because it processes either positive or negative changes in signals coming from photodetector 2. It accomplishes such bi-polar processing by measuring only the difference in charge accumulated during two integration periods when column 14 (and hence deposit 16 and barrier 28) are floating. Because only changes in surface potential are measured by the fill/spill circuit, non-changing sources of pattern noise are minimized. Thus, the device has built in background suppression.

The bi-polar fill/spill circuit of FIG. 1 comprises a charge reservoir or storage well 44 formed by either an ion implant 46, a metal deposit 48, or a combination of both as shown in FIG. 1. Storage well 44 is separated from well 36 in the transfer channel by potential barrier 28 which forms a gate for controlling the flow of charge between these two wells.

Figure 6:
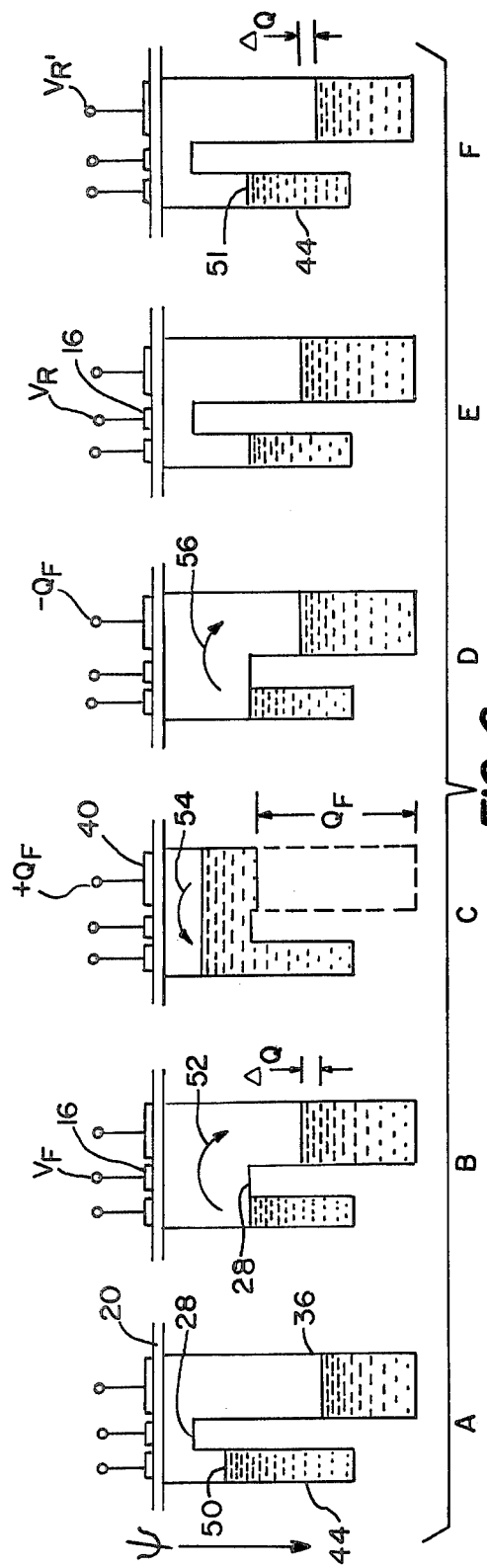
FIG. 6 is a diagram illustrating the bi-polar fill/spill process when the difference in charge between two cycles is positive.
Figure 7:
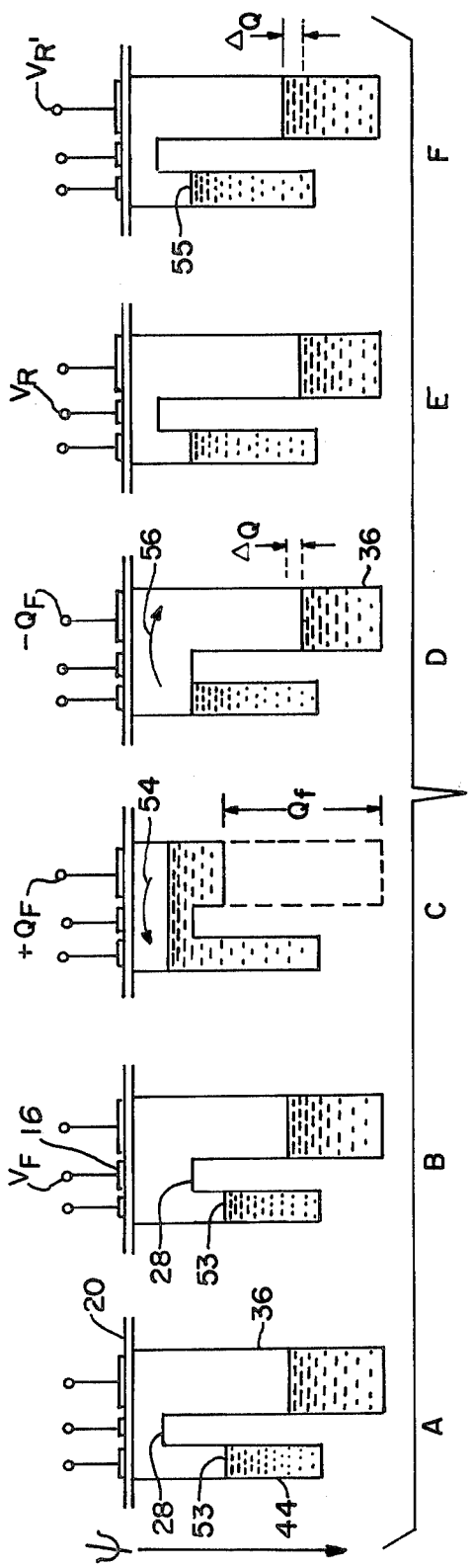
FIG. 7 is a diagram illustrating the bi-polar fill/spill process when the difference in charge between two cycles is negative.

The operation of the special bi-polar fill/spill circuit shown in FIG. 1 is shown in FIGS. 6 and 7. The flow of charge across potential barrier 28 can be compared to the flow of water over a gate as the height of the gate and as the levels of the water on both sides of the gate change. FIG. 6 illustrates the case when the difference in charge between two cycles is positive, i.e. $\Delta Q > 0$. Such would be the case when the amount of radiation, $h\nu$, striking photodetector 2 is on the increase.

FIG. 6A represents the condition of the fill/spill circuit after a previous cycle and after potential barrier 28 and well 36 in the transfer channel have been reset to their reference voltages, $V_R$, $V_{R'}$, by switch 22 and clocking circuit 42. The charge level 50 in charge reservoir 44 is an indication of the charge from the previous cycle.

In FIG. 6B, metal deposit 16 and barrier 28 are allowed to float in response to changes in the surface potential of the detector insulator interface. This is the integration time period 30 shown in FIG. 2 and can last for about 100 milliseconds. As shown in FIG. 6B, increasing surface potential causes potential barrier 28 to lower below the level 50 of charge in reservoir 44 causing charge to spill over barrier 28 as shown by arrow 52 into well 36. The charge in well 36 is thus increased by an amount equal to $\Delta Q$.

At the end of integration period 30, a fixed charge, $Q_F$, is applied to deposit 40 so that the charge in well 36 overflows barrier 28 as shown by arrow 54. This charge is then removed as shown in FIG. 6D so that the charge flows back into well 36 as shown by arrow 56. Steps C and D are conducted in order to fill reservoir 44 to the level of barrier 28; although for the situation shown in FIG. 6, reservoir 44 was already full.

In step 6E, reset voltage $V_R$ is applied to gate 16 to bring barrier 28 back to its original position in preparation for another floating cycle (B). Similarly, $\Delta Q$ is clocked out of CCD and its voltage reset in step 6F. The condition of the fill/spill circuit at step 6F is similar to the condition of step 6A except that the level 51 of reservoir 44 has decreased by an amount equal to $\Delta Q$.

FIG. 7 is similar to FIG. 6 except that it shows the operation of the bipolar fill/spill circuit when the difference in charge between two cycles is negative, i.e. $\Delta Q < 0$.

FIG. 7A represents the condition of the fill/spill circuit after a previous cycle and after potential barrier 28 and well 36 in the transfer channel have been reset to their reference voltages, $V_R$, $V_{R'}$, by switch 22 and clocking circuit 42. As in the example of FIG. 6, the charge level 53 is an indication of the charge from a previous cycle.

In FIG. 7B, gate 16 is allowed to float during integration period 30. However, the conditions are such that barrier 28 does not fall below level 53 and consequently there is no spill of charge in step 7B. Fill charge $Q_F$ is then applied and removed in steps 7C and 7D as previously described. However, some of fill charge $Q_F$ is left behind in reservoir 44 in order to bring level 53 up to the level of barrier 28. Thus, well 36 is short a charge equal to $\Delta Q$.

In steps 7E and 7F, barrier 28 is returned to its original set potential and $\Delta Q$ (now a negative $\Delta Q$) is clocked out of charge transfer channel 36. A new level of charge 55 is left in reservoir 44 so that it can be compared to changes during the next integration period.

Figure 8:
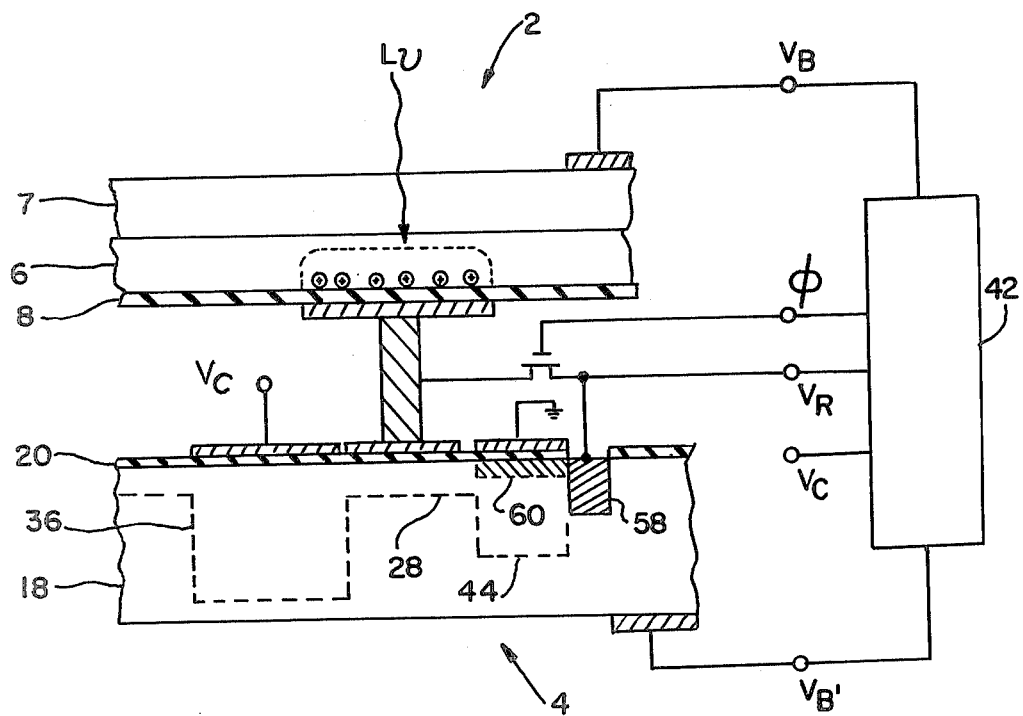
FIG. 8 is a partial cross section schematic of a photodetector array coupled to a silicon CCD illustrating an embodiment utilizing a conventional fill/spill circuit.
Figure 9:
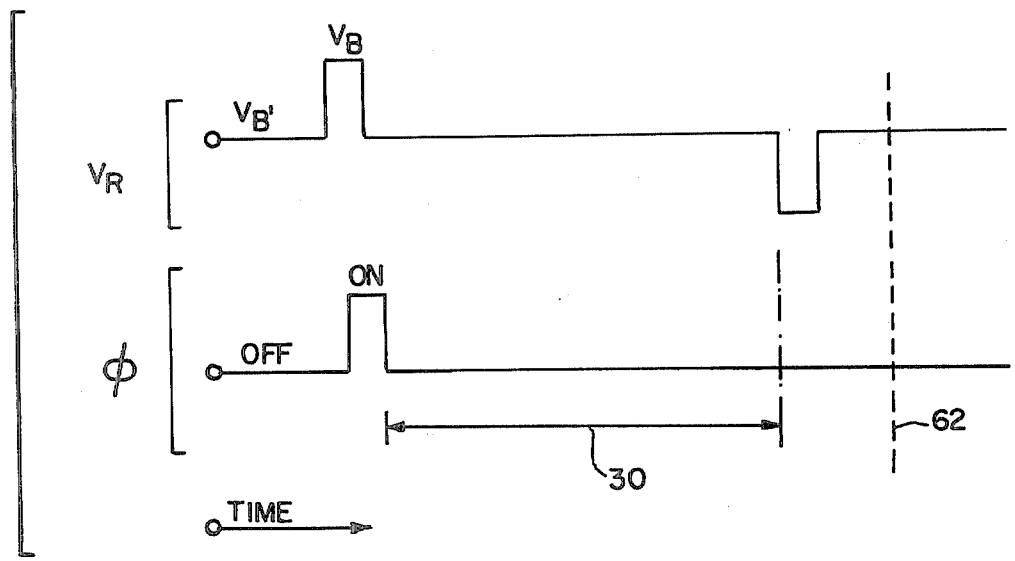
FIG. 9 is a pair of curves showing the relation between time, reset voltage, and switch position for the conventional fill/spill circuit of FIG. 8.

Other types of fill/spill circuits and clocking networks can be utilized to obtain a charge packet which is indicative of the change in surface potential during an integration period. FIG. 8 shows a conventional fill/spill circuit applied to the capacitively coupled voltage signal from a photodetector 2. Elements performing the same function as in FIG. 1 are given the same reference number in FIG. 8. An n+ doped fill/spill diode 58 is used in the conventional fill/spill circuit to supply charge for the circuit and an n doped area 60 is used to establish reservoir 44. The waveforms for reset voltage $V_R$ and corresponding switch position $\phi$ are shown in FIG. 9. A complete fill/spill operation is performed at the time shown by dashed line 62.

Figure 10:
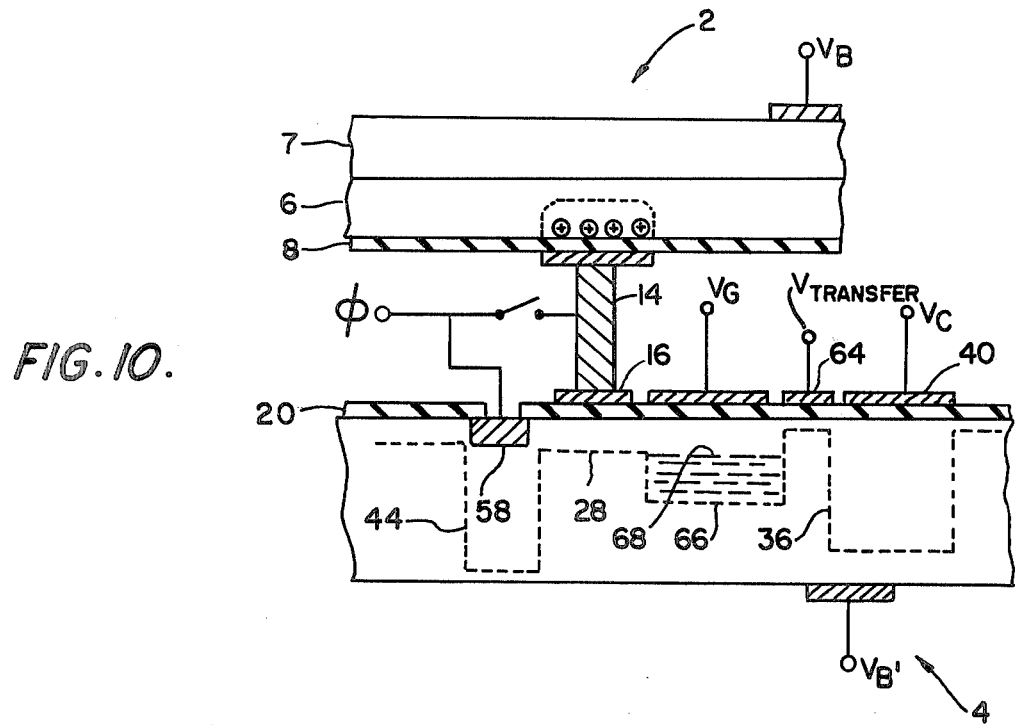
FIG. 10 is a partial cross section schematic of a photodetector array coupled to a silicon CCD illustrating an embodiment utilizing a sample hold type fill/spill circuit.

FIG. 10 shows a third embodiment using a sample-hold, fill/spill circuit and a 3½ phase clock scheme. In this layout, one portion 66 of the CCD is used as the storage gate and the transfer gate 64 is used as the metering gate. A reference charge is used to set level 68 in reference phase 66. A cell size of less than $2 \times 2$ mil² can be realized using the concept of FIG. 10. The fill/spill scheme can be made adaptive by adding a samplehold FET between the storage gate and the metering gate.

Numerous variations and modifications may be made without departing from the present invention. Accordingly, it should be clearly understood that the form of the present invention described above and shown in the accompanying drawings is illustrative only and is not intended to limit the scope of the present invention.

What is claimed is:

1. A fill/spill device for receiving a capacitively coupled voltage input during an operating period, said device comprising:

a semiconductive material having an electrical contact for applying a voltage to said material and having an insulating layer on a surface;

a first charge storage well in said material;

a first conductive deposit on said insulating layer spaced a short distance from said first charge storage well, said first deposit being couplable to a voltage to form a second charge storage well under said first deposit;

a second conductive deposit on said insulating layer in the space between said first and said second wells, said second wells, said second deposit being couplable to a capacitively coupled voltage input to form a potential barrier gate between said first and said second wells;

means connected to said electrical contact for biasing said semiconductive material to a predetermined voltage;

means connected to said second deposit to periodically apply a predetermined reset voltage to said second deposit and to then turn off said reset voltage so that said second deposit is allowed to float in response to the capacitively coupled voltage input; and means connected to said first deposit for periodically applying and then removing a predetermined fill voltage to said first deposit so that charge in said second well flows over said gate and fills said first well to the level of said gate, said means connected to said first deposit further including clocking means for periodically transferring charge out of said second well and for periodically resetting the voltage of said first deposit, whereby a signal charge is added or subtracted from said second well, the magnitude of said signal charge being a function of the difference in voltage existing between two adjacent operating periods.

2. The fill/spill device as claimed in claim 1, wherein said second charge storage well comprises a potential well in a channel of potential wells in a charge-coupled device.

3. The device as claimed in claim 1, wherein said first storage well is formed by an ion implanted region under said insulating layer.

4. The device as claimed in claim 1, wherein said first storage well is formed by a third conductive deposit on said insulating layer which is couplable to a voltage.

5. In a fill/spill device for receiving a capacitively coupled voltage input during an operating period, said device comprising:

a semiconductive material having an electrical contact for applying a voltage to said material and having an insulating layer on a surface;

a first charge storage well in said material;

a first conductive deposit on said insulating layer spaced a short distance from said first charge storage well, said first deposit being couplable to a voltage to form a second charge storage well under said first deposit; and a second conductive deposit on said insulating layer in the space between said first and said second wells, said second deposit being couplable to a capacitively coupled voltage input to form a potential barrier gate between said first and said second wells; a method of processing a capacitively coupled voltage signal, comprising the steps of:

providing at least a first and second charge storage well with a gate between them in said semiconductive material, said second well containing a predetermined charge and said second deposit being set at a predetermined voltage;

applying the signal to said second deposit for a predetermined time and allowing the potential of said gate to float in response to the signal, and allowing charge stored in said first well to spill into said second well if the potential of said gate floats to below the potential of the charge stored in said first well;

applying a fixed potential to said first deposit sufficient to cause charge to flow from said second well over said gate and fill said first well above said gate removing said fixed potential from said first deposit so that the charge in said first well is lowered to the level of said gate and the quantity of said predetermined charge is reduced by the quantity of any charge required to fill said first well to said level of said gate and increased by the quantity of any charge spilled out of said well during floating of said gate;

resetting said second deposit to said predetermined voltage and clocking the charge out of said second well;

resetting the voltage of said first deposit to provide said predetermined charge; and repeating said steps beginning with said step of applying the signal to said second deposit 6. A device for processing a capacitively coupled voltage signal, comprising:
- a semiconductive material having an electrical contact for applying a voltage to said material and having an insulating layer on a surface;
- a first charge storage well in said material;
- a first conductive deposit on said insulating layer spaced a short distance from said first charge storage well, said first deposit being couplable to a voltage to form a second charge storage well under said first deposit; and
- a second conductive deposit on said insulating layer in the space between said first and said second wells, said second deposit being couplable to a capacitively coupled voltage input to form a potential barrier gate between said first and said second wells; said second well containing a predetermined charge and said second deposit being set at a predetermined set voltage; means for applying the signal to said second deposit for a predetermined time and allowing the potential of said gate to float in response to the signal so that charge stored in said first well is spilled into said second well if the potential of said gate floats to below the potential of the charge stored in said first well; means for applying a fixed potential to said first deposit sufficient to cause charge to flow from said second well over said gate and fill said first well above said gate means for removing said fixed potential from said first deposit so that the charge in said first well is lowered to the level of said gate and the quantity of said predetermined charge is reduced by the quantity of any charge required to fill said first well to said level of said gate and increased by the quantity of any charge spilled out of said first well during floating of said gate means for resetting said second deposit to said predetermined voltage and for clocking the charge out of said second well;

means for resetting the voltage of said first deposit to provide said predetermined charge; and means for periodically activating said applying, removing, and resetting means in repeating cycles.

* * * * *